(12) United States Patent
Kasahara (10) Patent No.: US 12,034,430 B2
(45) Date of Patent: *Jul. 9, 2024

(54) VIBRATOR DEVICE

(71) Applicant: Seiko Epson Corporation, Tokyo (JP)

(72) Inventor: Shoichiro Kasahara, Minowa (JP)

(73) Assignee: SEIKO EPSON CORPORATION (JP)

( * ) Notice: Subject to any disclaimer, the term of this patent is extended or adjusted under 35 U.S.C. 154(b) by 274 days.

This patent is subject to a terminal disclaimer.

(21) Appl. No.: 17/399,452

(22) Filed: Aug. 11, 2021

(65) Prior Publication Data

US 2022/0052668 A1  Feb. 17, 2022

(30) Foreign Application Priority Data

Aug. 12, 2020 (JP) ................. 2020-136443

(51) Int. Cl.
 *H03H 9/17*  (2006.01)

(52) U.S. Cl.
 CPC .................. *H03H 9/172* (2013.01)

(58) Field of Classification Search
 CPC .... H03H 9/172; H03H 9/1021; H03H 9/0542; H03H 9/10; H03H 9/19; H05K 1/18
 See application file for complete search history.

(56) References Cited

U.S. PATENT DOCUMENTS

| | | | |
|---|---|---|---|
| 8,384,486 B2 * | 2/2013 | Nishio | H03B 1/02 331/107 A |
| 9,083,312 B1 | 7/2015 | Byers et al. | |
| 2002/0040444 A1 | 4/2002 | Ohie et al. | |
| 2007/0152537 A1 | 7/2007 | Yamaguchi et al. | |
| 2007/0229178 A1 | 10/2007 | Harima | |
| 2017/0104473 A1 | 4/2017 | Fukuzawa | |
| 2020/0058843 A1 * | 2/2020 | Mizugaki | H03H 9/1021 |
| 2020/0207283 A1 | 7/2020 | Mizugaki | |
| 2020/0212874 A1 | 7/2020 | Mizugaki | |

FOREIGN PATENT DOCUMENTS

| | | |
|---|---|---|
| JP | 2002-175127 A | 6/2002 |
| JP | 2009-027477 A | 2/2009 |
| JP | 2012-050057 A | 3/2012 |
| JP | 2014-146907 A | 8/2014 |
| JP | 2014-150453 A | 8/2014 |
| JP | 2014-205235 A | 10/2014 |
| JP | 2017-073683 A | 4/2017 |
| JP | 2017-139717 A | 8/2017 |
| JP | 2020-108088 A | 7/2020 |
| JP | 2020-108109 A | 7/2020 |

* cited by examiner

*Primary Examiner* — Andrea Lindgren Baltzell
*Assistant Examiner* — Kimberly E Glenn
(74) *Attorney, Agent, or Firm* — Harness, Dickey & Pierce, P.L.C.

(57) ABSTRACT

A vibrator device includes a package including a base that is a semiconductor substrate and a lid that is a semiconductor substrate and has a housing section, a vibrator element and a passive element housed in the housing section and placed at the base, an oscillation circuit placed at the base and electrically coupled to the vibrator element, and a mounting terminal placed at the package and electrically coupled to the passive element, and at least one of the base and the lid is coupled to fixed potential.

11 Claims, 7 Drawing Sheets

VIBRATOR DEVICE

The present application is based on, and claims priority from JP Application Serial Number 2020-136443, filed Aug. 12, 2020, the disclosure of which is hereby incorporated by reference herein in its entirety.

BACKGROUND

1. Technical Field

The present disclosure relates to a vibrator device.

2. Related Art

JP-A-2002-175127 describes a microcontroller including an oscillation circuit and a USB control section as a transmission control section that operates based on an oscillation signal from the oscillation circuit. In JP-A-2002-175127, a vibrator is externally coupled to the oscillation circuit. An IC including an application circuit that operates based on the oscillation signal from the oscillation circuit, an example of the IC being the USB control section, typically requires a capacitor, a chip resistor, an inductor, and other components as externally attached parts, for example, to stabilize the circuit, and the externally attached parts are mounted along with the IC on a substrate.

Noise is, however, superimposed on the inside of wiring lines to which the externally attached parts are coupled due to the influence of electromagnetic noise applied from the outside environment to the externally attached parts and mounting pads on which the externally attached parts are mounted. There is another problem of an adverse effect of electromagnetic noise emitted from the externally attached parts and the mounting pads on which the externally attached parts are mounted on an external circuit.

SUMMARY

A vibrator device according to the present disclosure includes a package including a base that is a semiconductor substrate and a lid that is a semiconductor substrate and has a housing section, a vibrator element and a passive element housed in the housing section and placed at the base, an oscillation circuit placed at the base and electrically coupled to the vibrator element, and a mounting terminal placed at the package and electrically coupled to the passive element, and at least one of the base and the lid is coupled to fixed potential.

DESCRIPTION OF EXEMPLARY EMBODIMENTS

A vibrator device according to an application example of the present disclosure will be described below in detail based on embodiments shown in the accompanying drawings.

First Embodiment

Figure 1:
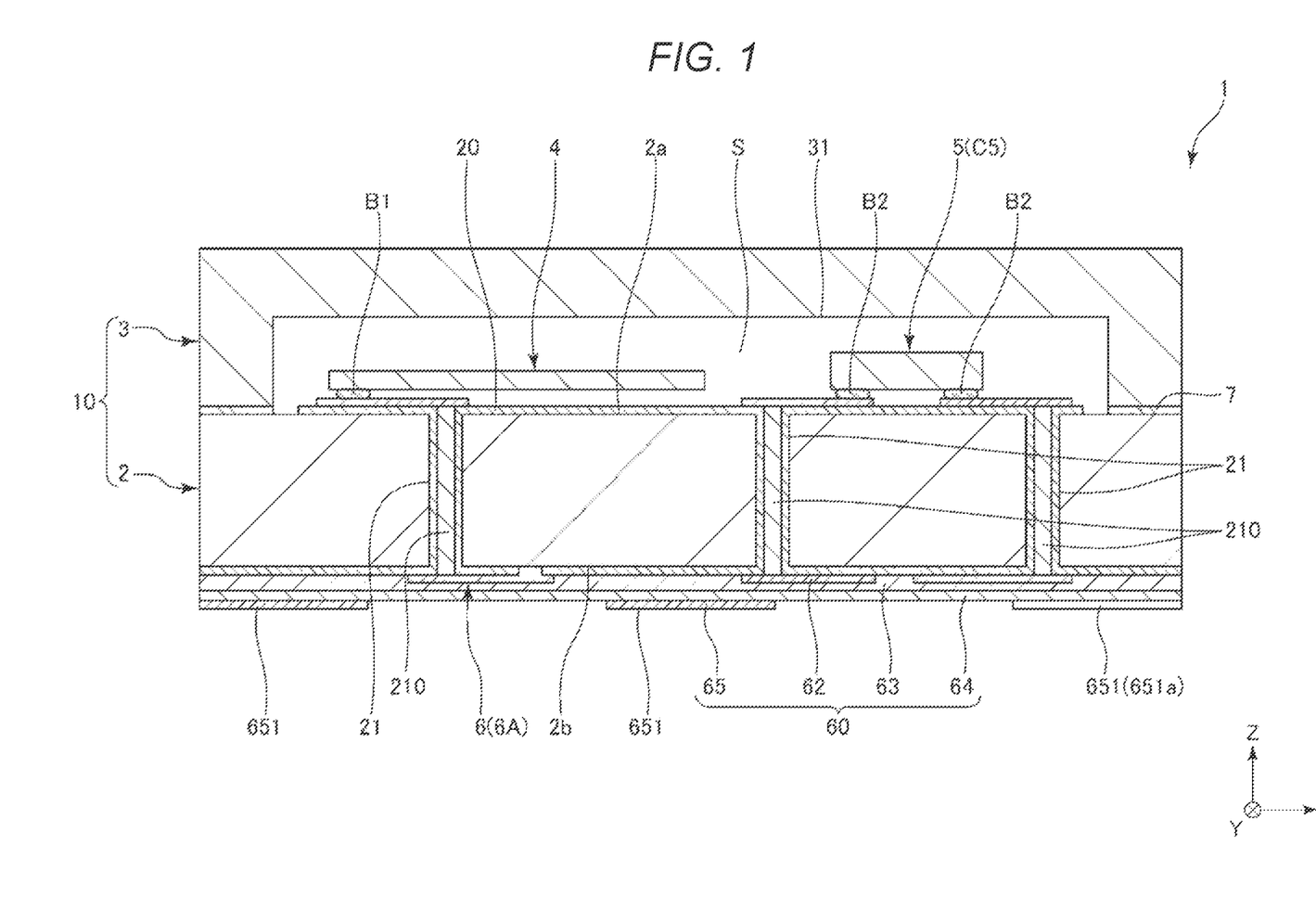
FIG. 1 is a cross-sectional view showing a vibrator device according to a first embodiment.
Figure 2:
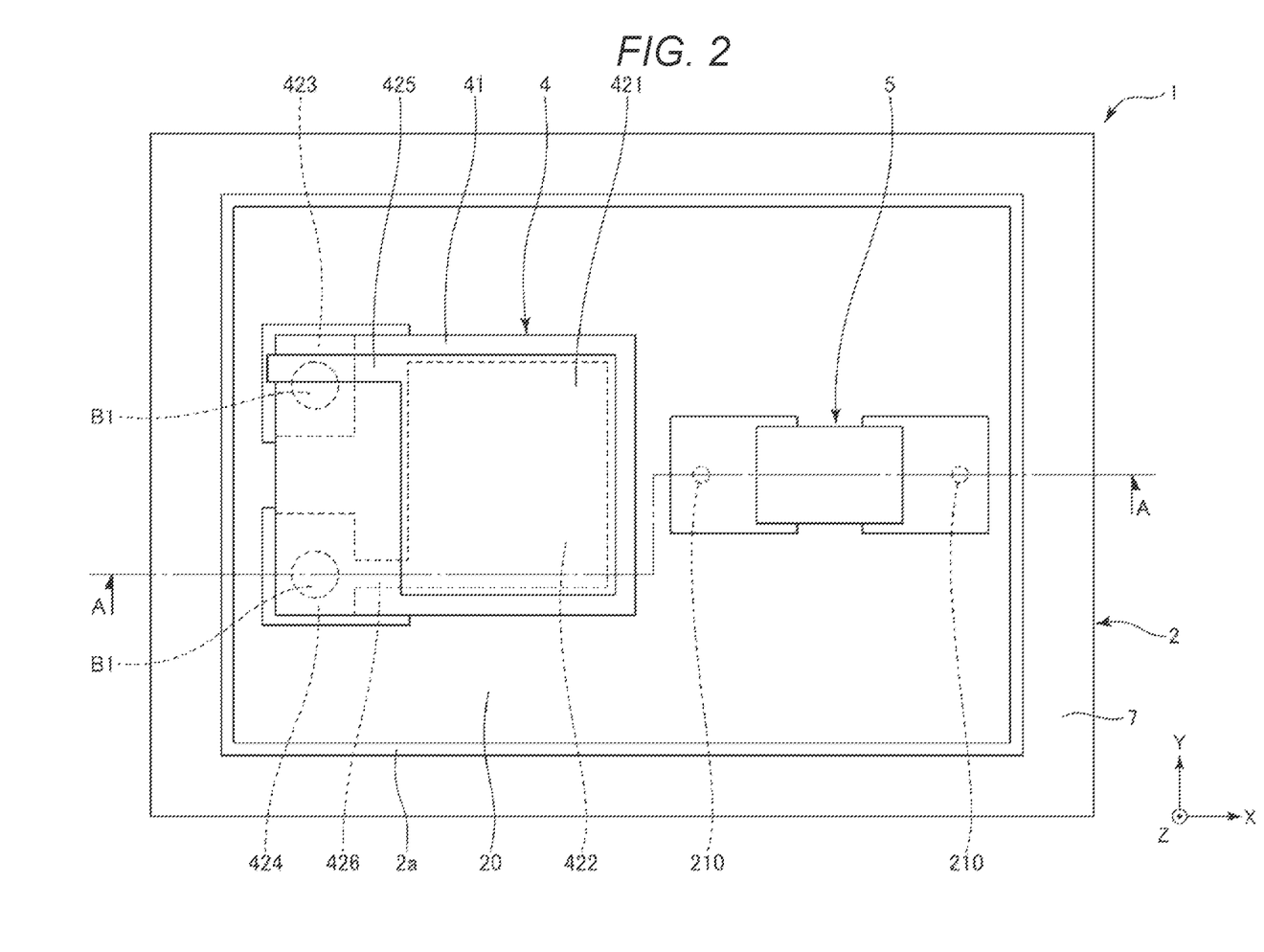
FIG. 2 is a plan view showing a vibrator element and a passive element provided in the vibrator device in FIG. 1.
Figure 3:
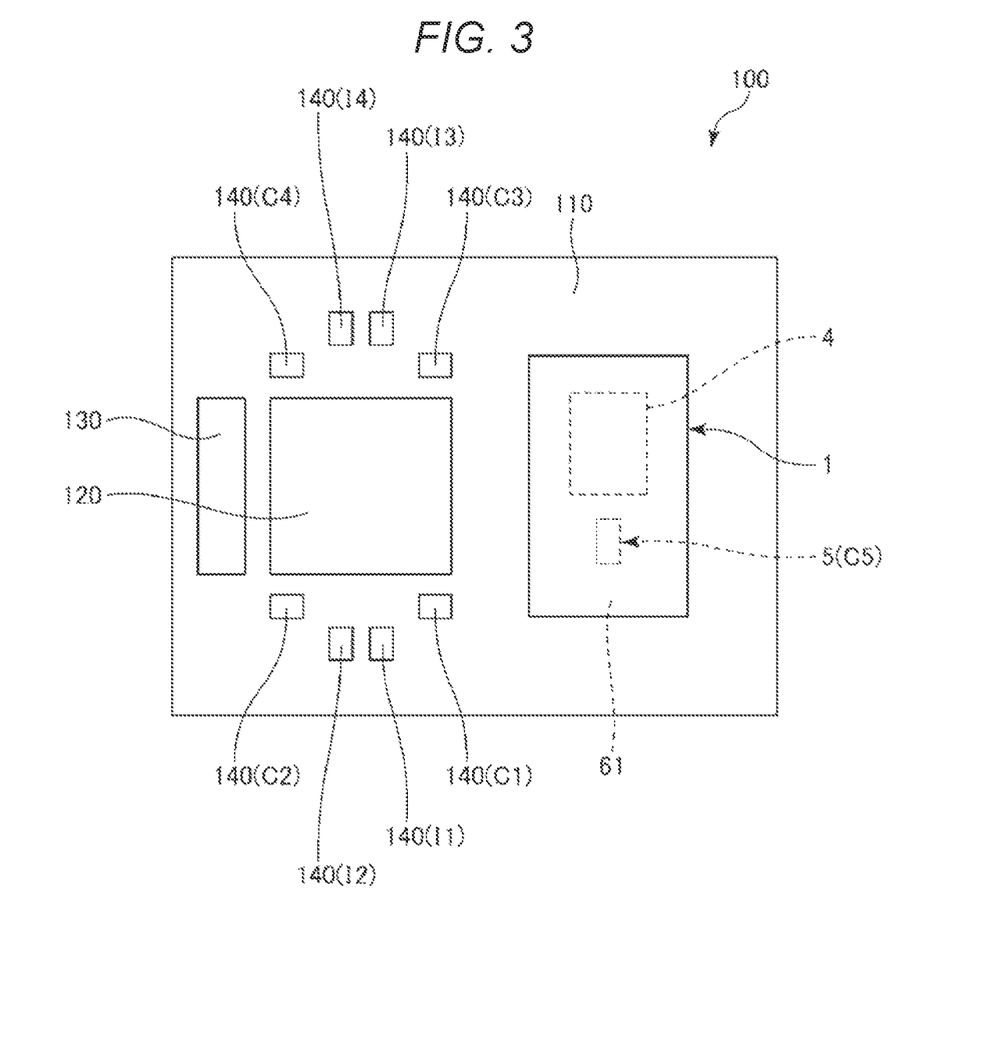
FIG. 3 is a plan view showing a circuit substrate on which the vibrator device in FIG. 1 is mounted.
Figure 4:
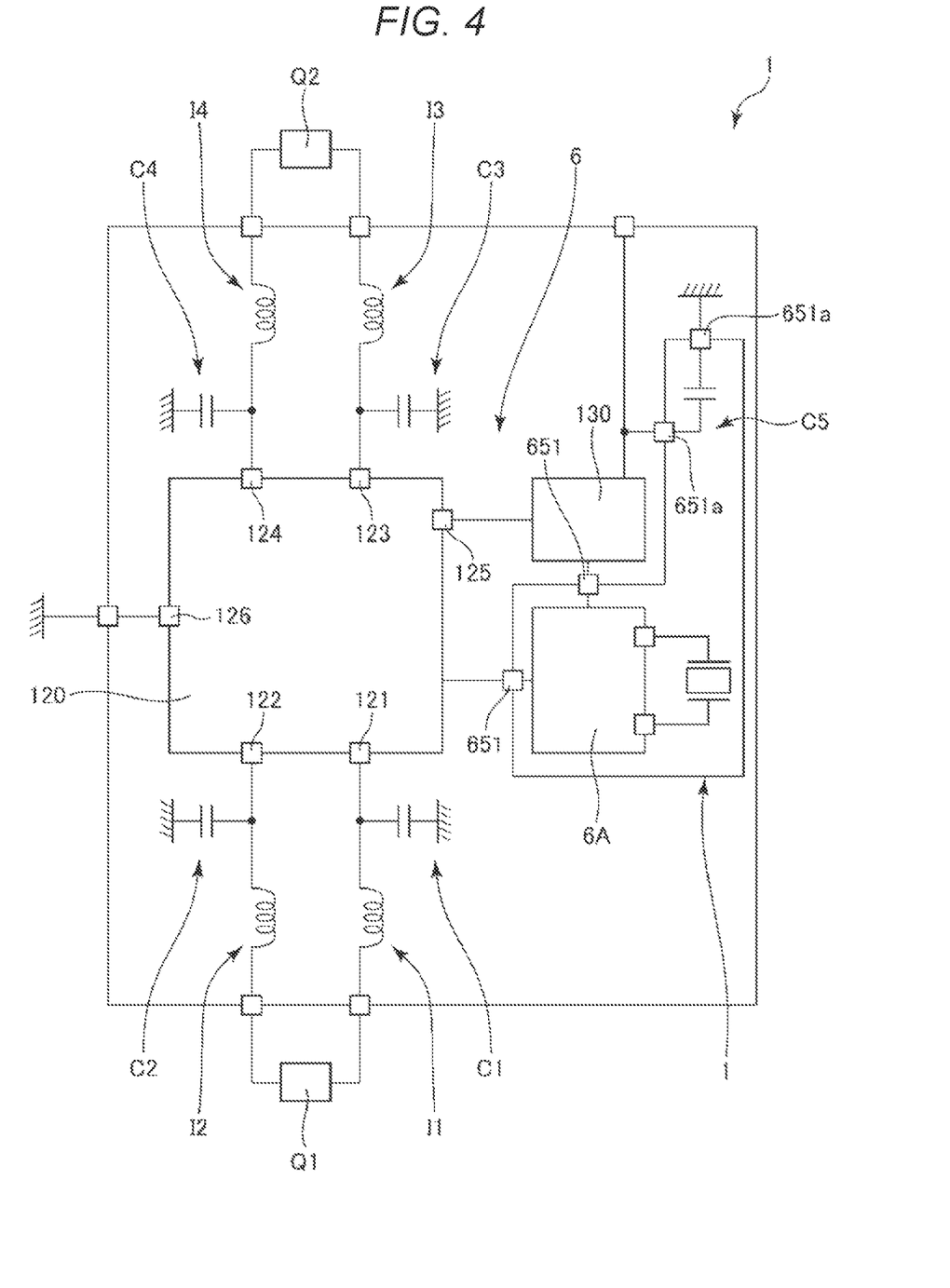
FIG. 4 is a block diagram of a circuit provided in the circuit substrate in FIG. 3.

FIG. 1 is a cross-sectional view showing a vibrator device according to a first embodiment. FIG. 2 is a plan view showing a vibrator element and a passive element provided in the vibrator device in FIG. 1. FIG. 3 is a plan view showing a circuit substrate on which the vibrator device in FIG. 1 is mounted. FIG. 4 is a block diagram of a circuit provided in the circuit substrate in FIG. 3.

FIG. 1 is a cross-sectional view taken along the line A-A in FIG. 2. FIGS. 1 and 2 show axes X, Y, and Z as three axes perpendicular to one another for convenience of description. The side that the arrow in the axis-Z direction faces is also called an "upper side", and the opposite side is also called a "lower side". A plan view viewed in the axis-Z direction is also simply referred to as a "plan view". In the following description, "placement at an upper surface" includes not only placement directly at the upper surface but placement in a position separate from the upper surface by a predetermined distance, that is, "placement in a position facing the upper side". The same holds true for a lower surface.

A vibrator device 1 shown in FIG. 1 includes a package 10, which has an internal housing section S, a vibrator element 4, and a passive element 5, the latter two components housed in the housing section S. The package 10 includes a base 2, at which the vibrator element 4 and the passive element 5 are placed, and a lid 3 so bonded to an upper surface 2a of the base 2 as to cover the vibrator element 4 and the passive element 5. An integrated circuit 6 is formed at the base 2.

The base 2 is a silicon substrate, particularly, a P-type silicon substrate. It is, however, noted that the base 2 is not limited to a specific substrate and may instead be an N-type silicon substrate. Still instead, the base 2 may be a semiconductor substrate that is not made of silicon, for example, a semiconductor substrate made of Ge, GaP, GaAs, InP, or any other suitable substance.

The base 2 has a plate-like shape and has the upper surface 2a and a lower surface 2b, which are a front surface and a rear surface, respectively. The surfaces of the base 2 are covered with an insulating film 20. The integrated circuit 6, which is electrically coupled to the vibrator element 4, is formed at the lower surface 2b of the base 2. Forming the integrated circuit 6 at the base 2 as described above allows effective use of the space occupied by the base 2. In particular, forming the integrated circuit 6 at the lower surface 2b allows the space where the integrated circuit 6 is formed to be widened, as compared with a case where the integrated circuit 6 is formed at the upper surface 2a, by the size corresponding to the region where the upper surface 2a is bonded to the lid 3. It is, however, noted that the integrated circuit 6 may be formed at the upper surface 2a of the base 2 instead of the lower surface 2b thereof.

The integrated circuit 6 includes an oscillation circuit 6A that is electrically coupled to the vibrator element 4 and generates an oscillation signal, such as a clock signal, by causing the vibrator element 4 to oscillate. The integrated circuit 6 may include a circuit in addition to the oscillation circuit 6A. An example of the circuit may include a processing circuit that processes an output signal from the oscillation circuit 6A, and an example of the processing circuit may include a PLL circuit.

A laminate 60, which is formed of a wiring layer 62, an insulating layer 63, a passivation film 64, and a terminal layer 65 laminated on each other, is provided at the lower surface 2b of the base 2. A plurality of active elements that are not shown but are formed at the lower surface 2b are electrically coupled to each other via wiring lines provided in the wiring layer 62 to form the integrated circuit 6. The terminal layer 65 includes a plurality of mounting terminals 651. The plurality of mounting terminals 651 are electrically coupled to the oscillation circuit 6A and the passive element 5 and include, for example, a terminal coupled to a power supply, a terminal coupled to the ground, a terminal via which the oscillation signal from the oscillation circuit 6A is outputted, and a terminal electrically coupled to the passive element 5. In particular, the terminal electrically coupled to the passive element 5 is also referred below to as a mounting terminal 651a.

The insulating layer 63 is made of silicon oxide (SiO$_2$), and the wiring layer 62 and the terminal layer 65 are made of an electrically conductive material, such as electrically conductive polysilicon and tungsten (W). It is, however, noted that the material that forms each of the sections described above is not limited to a specific material and can be any material that can provide the function of the section.

The laminate 60 includes one wiring layer 62 for convenience of description, but not necessarily, and a plurality of wiring layers 62 may be laminated on each other via the insulation layer 63. That is, the wiring layer 62 and the insulating layer 63 may be alternately laminated on each other multiple times. In this case, for example, wiring lines can be routed in a circuit and the plurality of mounting terminals 651 can be placed with increased degrees of flexibility.

A plurality of through holes 21 are formed in the base 2 and pass through the base 2 in the thickness direction thereof. The through holes 21 are each filled with an electrically conductive material. Through electrodes 210 are thus formed. A plurality of wiring lines electrically coupled to the vibrator element 4 and the passive element 5 are placed on the upper surface 2a of the base 2, as shown in FIG. 2. Out of the wiring lines, the wiring line electrically coupled to the vibrator element 4 is electrically coupled to the oscillation circuit 6A via one of the through electrodes 210. The wiring line electrically coupled to the passive element 5 is electrically coupled to the mounting terminal 651a via one of the through electrodes 210.

The lid 3 is a silicon substrate, as the base 2 is. The coefficients of linear expansion of the base 2 and the lid 3 are therefore equal to each other, so that thermal stress caused by thermal expansion is suppressed, whereby the vibrator device 1 has excellent vibration characteristics. Further, the vibrator device 1 can be formed in a semiconductor process, whereby the vibrator device 1 can be manufactured with precision, and the size of the vibrator device 1 can be reduced. The lid 3 is not necessarily made of a specific material, and a semiconductor substrate that is not made of silicon, for example, a semiconductor substrate made of Ge, GaP, GaAs, InP, or any other suitable substance may be used as the lid 3.

The lid 3 has a bottomed recess 31, which opens via the lower surface of the lid 3 and houses the vibrator element 4 and the passive element 5, as shown in FIG. 1. The lid 3, specifically, the lower surface thereof is directly bonded to the upper surface 2a of the base 2 via a bonding member 7.

The housing section S, which is the space that houses the vibrator element 4 and the passive element 5, is thus formed between the lid 3 and the base 2. In the present embodiment, the lid 3 is bonded to the base 2 by using, among a variety of types of direct bonding, diffusion bonding utilizing intermetal diffusion. The method for bonding the lid 3 to the base 2 is, however, not limited to a specific method.

The housing section S is hermetically sealed and has a decompressed atmosphere, preferably, in a state closer to vacuum. The oscillation characteristics of the vibrator element 4 are thus improved. The housing section S, however, does not necessarily have a specific atmosphere and may have an atmosphere containing an inert gas, such as nitrogen or Ar, encapsulated in the housing section S. The housing section S also does not necessarily have a decompressed atmosphere and may have an atmospheric-pressure or pressurized atmosphere.

The bonding member 7 has electrical conductivity. The lid 3 is therefore electrically coupled to the base 2 via the bonding member 7. The base 2 is a P-type silicon substrate as described above and is therefore grounded when the vibrator device 1 is driven. That is, the base 2 is coupled to GND, which is fixed potential. The lid 3 is therefore also coupled to GND. The entire package 10 is thus coupled to GND and therefore provides a shielding function of blocking electromagnetic noise from the outside environment. Superposition of electromagnetic noise from the outside environment on the inside of the passive element 5 and the wiring lines coupled to the passive element 5 in the housing section S can therefore be effectively suppressed. Further, electromagnetic noise emitted from the interior of the housing section S can be blocked, so that superposition of the electromagnetic noise on the inside of passive elements and wiring lines placed outside the package 10 can be effectively suppressed. The circuit characteristics of the vibrator device 1 are therefore stabilized. Further, a variety of circuit parts can be placed in the vicinity of the package 10 because the circuit parts are unlikely to be affected by the electromagnetic noise, whereby the size of the entire circuit including the vibrator device 1 can be reduced.

In the present embodiment, the base 2 and the lid 3 are coupled to GND as described above, but not necessarily, and at least one of the base 2 and the lid 3 only needs to be coupled to GND. The functions described above can thus be provided.

The vibrator element 4 includes a vibration substrate 41 and electrodes placed at the surface of the vibration substrate 41, as shown in FIG. 2. The vibration substrate 41 operates in a thickness-shear vibration mode and is formed of an AT-cut quartz substrate in the present embodiment. The AT-cut quartz substrate has tertiary frequency-temperature characteristics and therefore forms the vibrator element 4 having excellent temperature characteristics. The electrodes are formed of an excitation electrode 421, which is placed at the upper surface of the vibration substrate 41, and an excitation electrode 422, which is so placed at the lower surface of the vibration substrate 41 as to face the excitation electrode 421. The electrodes include a pair of terminals 423 and 424 placed at the lower surface of the vibration substrate 41, a wiring line 425, which electrically couples the terminal 423 to the excitation electrode 421, and a wiring line 426, which electrically couples the terminal 424 to the excitation electrode 422.

The configuration of the vibrator element 4 is not limited to the configuration described above. For example, the vibrator element 4 may be a mesa-type vibrator element in which a vibration region sandwiched between the excitation electrodes 421 and 422 protrudes from the portion around the vibration region or may conversely be an inverted-mesa-type vibrator element in which the vibration region is recessed from the portion therearound. A peripheral portion of the vibration substrate 41 may be ground in a beveling process, or the vibration substrate 41 may undergo a convex-shape forming process that produces convexly curved upper and lower surfaces.

The vibrator element 4 does not necessarily vibrate in the thickness-shear vibration mode and may, for example, be a vibrator element having a plurality of vibrating arms that undergo bending vibration in the in-plane direction. That is, the vibration substrate 41 is not necessarily formed of an AT-cut quartz substrate and may instead be formed of a quartz substrate other than an AT-cut quartz substrate, for example, an X-cut quartz substrate, a Y-cut quartz substrate, a Z-cut quartz substrate, a BT-cut quartz substrate, an SC-cut quartz substrate, or an ST-cut quartz substrate. In the present embodiment, the vibration substrate 41 is made of quartz, but not necessarily, and may instead be made, for example, of lithium niobate, lithium tantalate, lithium tetraborate, langacite, potassium niobate, gallium phosphate, or any other piezoelectric single crystal or piezoelectric single crystal other than the substances described above. Moreover, the vibrator element 4 is not limited to a piezoelectrically driven vibrator element and may be an electrostatically driven vibrator element using electrostatic force.

The thus configured vibrator element 4 is fixed to the upper surface 2a of the base 2 via a pair of electrically conductive bonding members B1 and electrically coupled to wiring lines placed on the upper surface 2a.

The passive element 5 is an element that consumes, accumulates, or dissipates supplied electric power, such as a capacitor, an inductor, and a resistor. The number of passive elements 5 and what is used as the passive element 5 can be set as appropriate in accordance with the application of the vibrator device 1. The thus defined passive element 5 has a chip-like shape, is fixed to the upper surface 2a of the base 2 via an electrically conductive bonding member B2, and is electrically coupled to the corresponding wiring line.

The bonding members B1 and B2 are each not limited to a specific member and may be any member having both electric conductivity and bondability. For example, the bonding members B1 and B2 may each be any of a variety of metal bumps, such as a gold bump, a silver bump, a copper bump, and a solder bump, or an electrically conductive adhesive, such as any of a variety of polyimide-based, epoxy-based, silicone-based, and acrylic adhesives with electrically conductive fillers, such as silver fillers, dispersed therein. Using the former metal bump as each of the bonding members B1 and B2 allows suppression of gases produced from the bonding members B1 and B2 and effective suppression of a change in the environment in the housing section S, in particular, an increase in pressure therein. On the other hand, when the latter electrically conductive adhesive is used as each of the bonding members B1 and B2, the bonding members B1 and B2 are each softer than the metal bump, so that stress induced in the bonding members B1 and B2 is unlikely to be transferred to the vibrator element 4.

The vibrator device 1 has been described above. A circuit substrate 100, on which the vibrator device 1 is mounted, will next be described. The circuit substrate 100 includes a printed circuit board 110, a circuit component 120, a regulator circuit component 130, the vibrator device 1, and a plurality of passive elements 140, the latter four components mounted on the printed circuit board 110, as shown in FIG. 3.

The circuit component 120 is a circuit that operates based on the oscillation signal generated by the oscillation circuit 6A. The circuit component 120 is not limited to a specific element. In the present embodiment, the circuit component 120 is a USB controller IC that is a transmission circuit that controls transmission and reception of signals via a USB connector. Using the transmission circuit as the circuit component 120 allows the vibrator device 1 to be incorporated in a variety of electronic instruments, whereby the convenience provided by the vibrator device 1 is improved. The regulator circuit component 130 supplies the circuit component 120 and the vibrator device 1 with stable electric power.

The circuit component 120 includes a pair of upstream terminals 121 and 122, a pair of downstream terminals 123 and 124, a power supply terminal 125, and a negative power supply terminal 126, as shown in FIG. 4. An upper-level terminal Q1 is coupled to the pair of upstream terminals 121 and 122, and a peripheral terminal Q2 is coupled to the pair of downstream terminals 123 and 124. The thus configured circuit component 120 uses the oscillation signal from the oscillation circuit 6A to operate in synchronization with transmission signals from the upper-level terminal Q1 and the peripheral terminal Q2. In the present embodiment, the pair of downstream terminals 123 and 124 are provided, and a plurality of pairs of downstream terminals may instead be provided, as in a USB-HUB configuration.

The plurality of passive elements 140 are elements for stabilizing the characteristics of the circuit component 120 and are each an element that consumes, accumulates, or dissipates supplied electric power, such as a capacitor, an inductor, and a resistor.

In the present embodiment, the following components are used as the passive elements 140: a capacitor C1 and an inductor I1 coupled to the upstream terminal 121; a capacitor C2 and an inductor I2 coupled to the upstream terminal 122; a capacitor C3 and an inductor I3 coupled to the downstream terminal 123; and a capacitor C4 and an inductor I4 coupled to the downstream terminal 124. Common-mode filters (noise reduction filters) are thus formed to remove noise from a signal transmitted via the circuit component 120, whereby the characteristics of the circuit component 120 are improved.

The passive element 5 provided in the vibrator device 1 is a capacitor C5 coupled to the regulator circuit component 130. The capacitor C5 can remove noise from power supply voltage supplied from an external apparatus, whereby stable power supply voltage can be supplied to the oscillation circuit 6A and the circuit component 120.

Since the package 10 coupled to GND can block the electromagnetic noise from the outside environment as described above, superposition of the electromagnetic noise from the outside environment on the inside of the capacitor C5 and the wiring lines coupled to the capacitor C5 in the housing section S can be effectively suppressed. Further, electromagnetic noise emitted from the interior of the housing section S can be blocked, so that superposition of the electromagnetic noise on the inside of the passive elements 140 and the wiring lines coupled to the passive elements 140 can be effectively suppressed. The circuit component 120 can therefore be stably driven. Further, the circuit component 120, the capacitors C1 to C4, and the inductors I1 to I4 can be placed in the vicinity of the vibrator device 1 because the components described above are unlikely to be affected by the electromagnetic noise from the vibrator device 1, whereby the size of the circuit substrate 100 can be reduced.

The passive element 5 housed in the package 10 is not limited to the capacitor C5. For example, the passive element 5 housed in the package 10 may be at least one of the capacitors C1 to C4 and the inductors I1 to I4. For example, the passive element 5 housed in the package 10 may be formed of the capacitors C1 and C2 and the inductors I1 and I2. In this case, it is preferable to symmetrically place the common mode filter for the upstream terminal 121 formed of the capacitor C1 and the inductor I1 and the common mode filter for the upstream terminal 122 formed of the capacitor C2 and the inductor I2 including the wiring lines coupled to the upstream terminals 121 and 122.

The vibrator device 1 has been described above. The vibrator device 1 includes the package 10, which includes the base 2, which is a semiconductor substrate, and the lid 3, which is a semiconductor substrate, and has the housing section S, the vibrator element 4 and the passive element 5, which are housed in the housing section S and placed at the base 2, the oscillation circuit 6A, which is placed at the base 2 and electrically coupled to the vibrator element 4, and the mounting terminal 651a, which is placed at the package 10 and electrically coupled to the passive element 5, as described above. At least one of the base 2 and the lid 3 is coupled to GND as fixed potential.

According to the configuration described above, the package 10 can provide the shielding function, whereby electromagnetic noise from the outside environment can be blocked. Superposition of electromagnetic noise from the outside environment on the inside of the passive element 5 and the wiring lines coupled to the passive element 5 in the housing section S can therefore be effectively suppressed. Further, electromagnetic noise emitted from the interior of the housing section S can be blocked, so that superposition of the electromagnetic noise on the inside of passive elements and wiring lines placed outside the package 10 can be effectively suppressed. The circuit characteristics of the vibrator device 1 are therefore stabilized. Further, a variety of circuit parts can be placed in the vicinity of the package 10 because the circuit parts are unlikely to be affected by the electromagnetic noise, whereby the size of the entire circuit including the vibrator device 1 can be reduced.

The base 2 and the lid 3 are each coupled to GND as fixed potential, as described above. The shielding effect of the package 10 is thus improved, whereby the effects described above can be more markedly provided.

Further, the oscillation circuit 6A is so placed as to face the lower surface 2b, which is a surface of the base 2 that is the opposite surface from the housing section S. Forming the oscillation circuit 6A at the base 2 as described above allows effective use of the space occupied by the base 2. In particular, forming the oscillation circuit 6A at the lower surface 2b allows the space where the oscillation circuit 6A is formed to be widened, as compared with a case where the oscillation circuit 6A is formed at the upper surface 2a, by the size corresponding to the region where the upper surface 2a is bonded to the lid 3.

Second Embodiment

Figure 5:
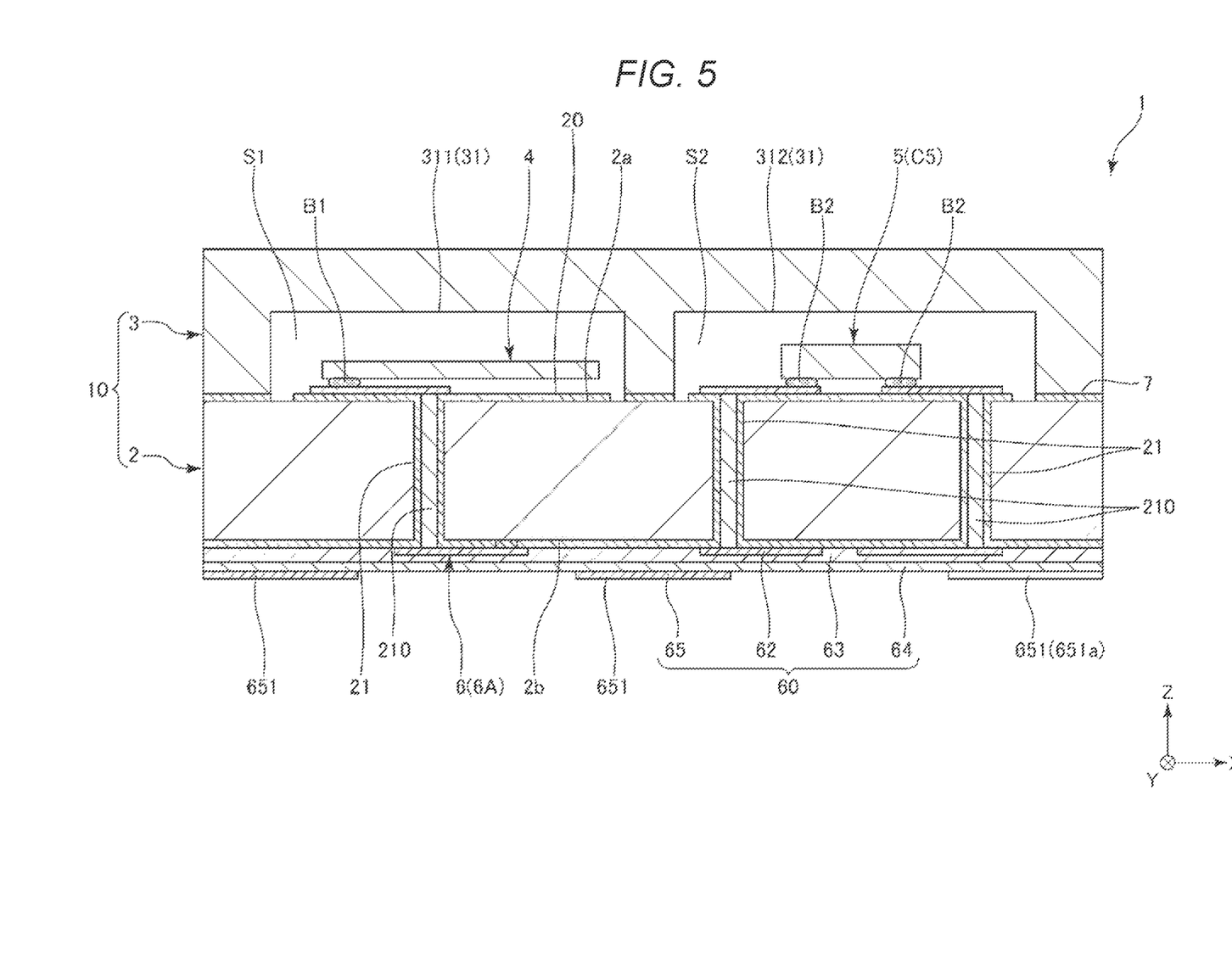
FIG. 5 is a cross-sectional view showing a vibrator device according to a second embodiment.

FIG. 5 is a cross-sectional view showing a vibrator device according to a second embodiment.

The present embodiment is the same as the first embodiment described above except that the package 10 has a different configuration. In the following description, the present embodiment will be described primarily on the difference from the embodiment described above, and the same items will not be described. In FIG. 5, the same configurations as those in the embodiments described above have the same reference characters.

In the vibrator device 1 according to the present embodiment, the lid 3 has two bottomed recesses 311 and 312, as shown in FIG. 5. The housing section S therefore includes a first housing section S1, which houses the vibrator element 4, and a second housing section S2, which houses the passive element 5. According to the configuration described above, electromagnetic coupling between the vibrator element 4 and the passive element 5 can be suppressed because the lid 3 is disposed between the vibrator element 4 and the passive element 5.

The thus configured second embodiment can provide the same effects as those provided by the first embodiment described above.

Third Embodiment

Figure 6:
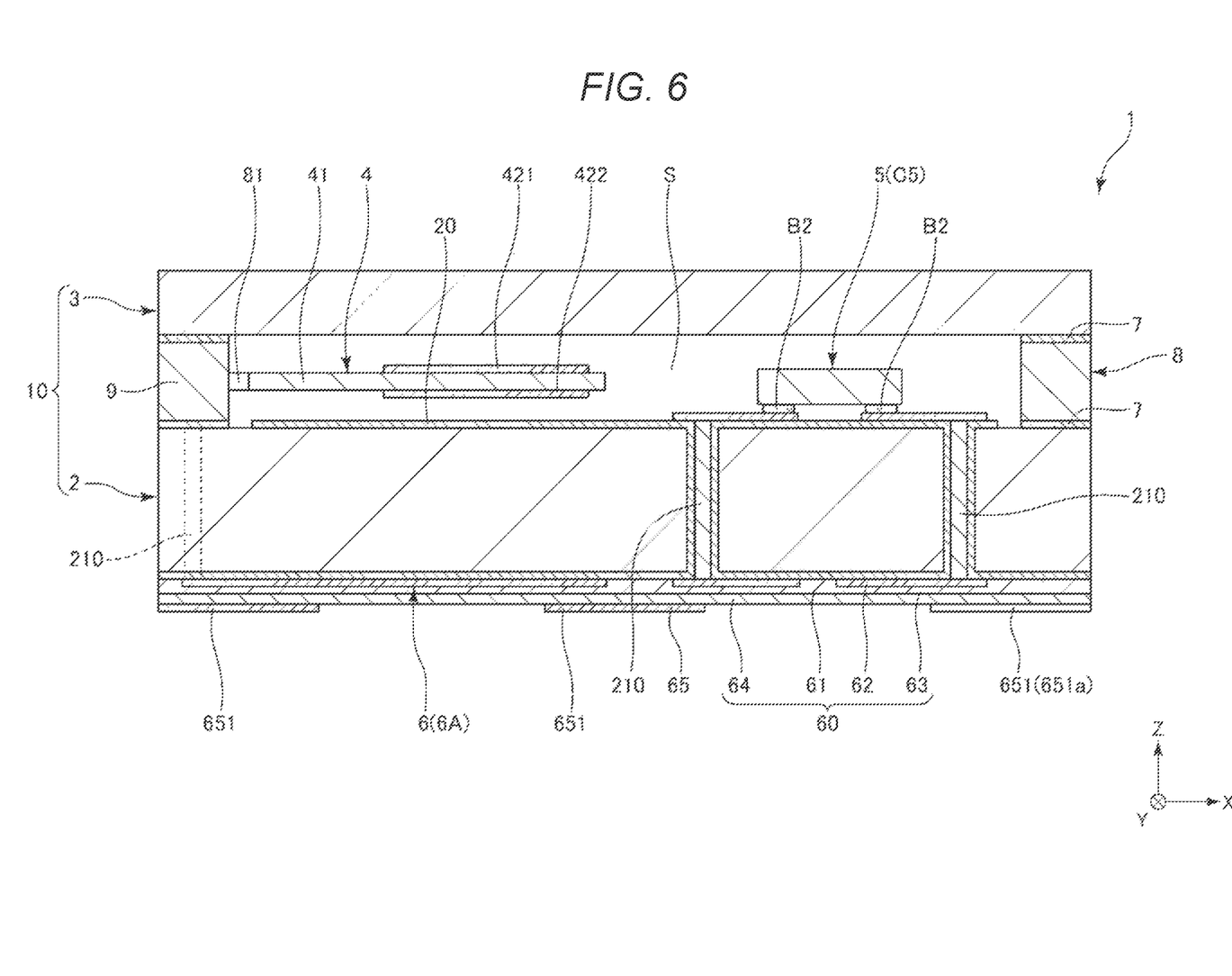
FIG. 6 is a cross-sectional view showing a vibrator device according to a third embodiment.

FIG. 6 is a cross-sectional view showing a vibrator device according to a third embodiment.

The present embodiment is the same as the first embodiment described above except that the package 10 has a different configuration. In the following description, the present embodiment will be described primarily on the difference from the embodiments described above, and the same items will not be described. In FIG. 6, the same configurations as those in the embodiments described above have the same reference characters.

In the vibrator device 1 according to the present embodiment, the base 2 and the lid 3 each have a plate-like shape, as shown in FIG. 6. The package 10 includes a spacer 9, which is interposed between the plate-shaped base 2 and lid 3 and forms the housing section S between the base 2 and the lid 3. The spacer 9 is integrated with the vibrator element 4. Specifically, the vibrator device 1 includes a quartz substrate 8 placed between the base 2 and the lid 3, and the vibration substrate 41, the frame-shaped spacer 9, which surrounds the vibration substrate 41, and a linkage section 81, which links the vibration substrate 41 to the spacer 9, are integrated with the quartz substrate 8. The upper surface of the spacer 9 is bonded to the lid 3 via the bonding member 7, and the lower surface of the spacer 9 is bonded to the base 2 via the bonding member 7. According to the configuration described above, the vibrator device 1 can be more readily manufactured because it is not necessary to form the recess 31 in the lid 3.

As described above, the package 10 in the present embodiment includes the spacer 9, which is interposed between the base 2 and the lid 3 and integrated with the vibrator element 4. It is therefore not necessary to form the recess 31 in the lid 3, whereby the vibrator device 1 is more readily manufactured accordingly.

The thus configured third embodiment can provide the same effects as those provided by the first embodiment described above.

Fourth Embodiment

Figure 7:
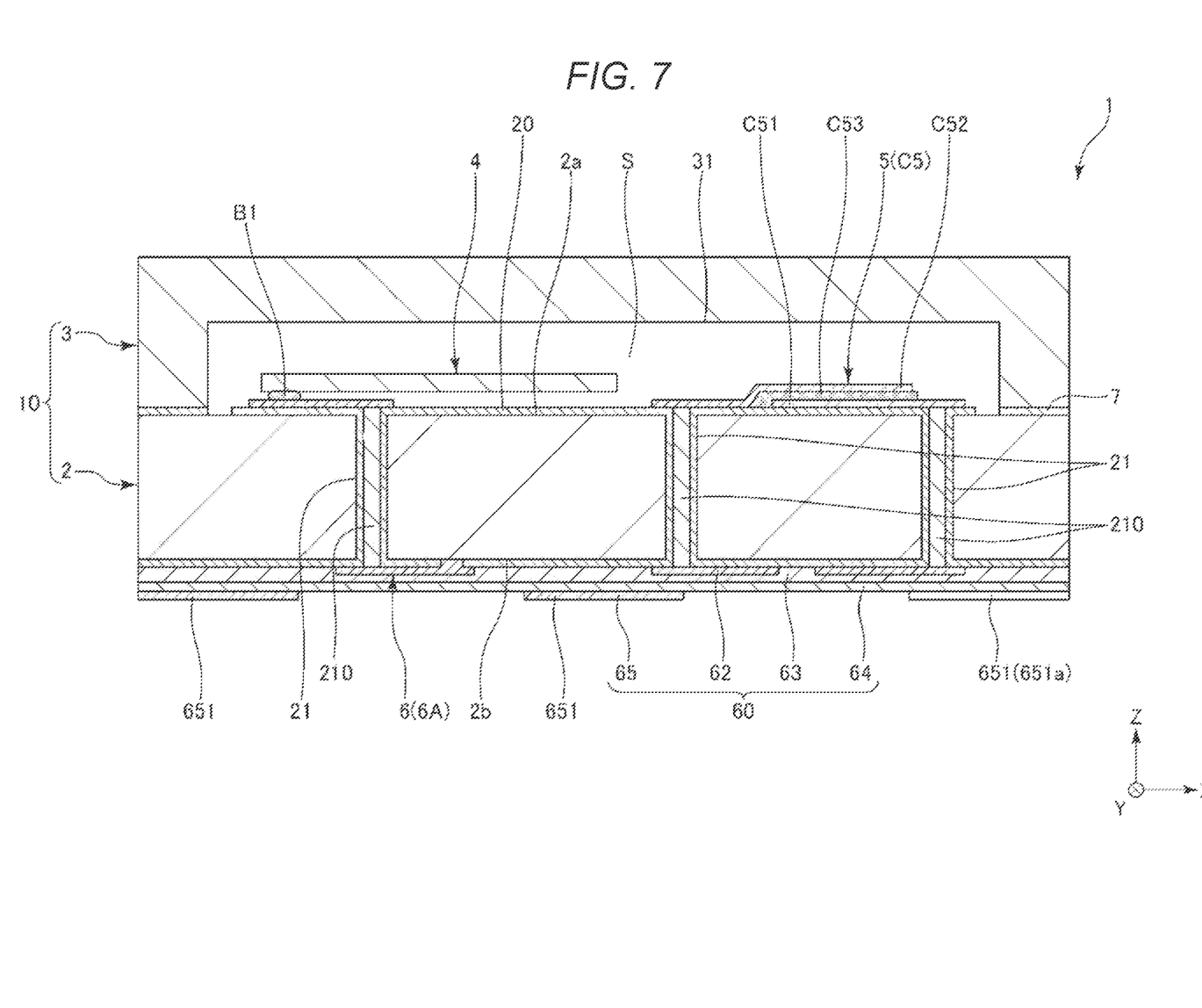
FIG. 7 is a cross-sectional view showing a vibrator device according to a fourth embodiment.

FIG. 7 is a cross-sectional view showing a vibrator device according to a fourth embodiment.

The present embodiment is the same as the first embodiment described above except that the package 10 has a different configuration. In the following description, the present embodiment will be described primarily on the difference from the embodiments described above, and the same items will not be described. In FIG. 7, the same configurations as those in the embodiments described above have the same reference characters.

In the vibrator device 1 according to the present embodiment, the thin-film-shaped passive element 5 is so formed on the upper surface 2a of the base 2 as to be integrated with the base 2, as shown in FIG. 7, unlike the passive element 5 bonded to the upper surface 2a of the base 2 via the electrically conductive bonding member B2 in the first embodiment described above. More specifically, the capacitor C5, which is the passive element 5, has a configuration in which a dielectric layer C53 is sandwiched between a lower electrode C51 and an upper electrode C52, and the electrodes and the layer are sequentially laminated on the upper surface 2a. According to the configuration described above, the vibrator device 1 can be readily manufactured because it is not necessary to position and mount the passive element 5. Further, since the thickness of the passive element 5 is suppressed, the height of the vibrator device 1 can be reduced as compared with that in the first embodiment described above.

When the integrated circuit 6 is formed at the upper surface 2a of the base 2, the passive element 5 may be formed in the integrated circuit 6.

As described above, the passive element 5 in the present embodiment is a thin-film-shaped element integrated with the upper surface 2a, which is a surface of the base 2 that is the surface facing the housing section S. According to the configuration described above, the vibrator device 1 can be readily manufactured because it is not necessary to position and mount the passive element 5. Further, since the thickness of the passive element 5 is suppressed, the height of the vibrator device 1 can be reduced as compared with that in the first embodiment described above.

The thus configured fourth embodiment can also provide the same effects as those provided by the first embodiment described above.

The vibrator devices according to the present disclosure have been described above based on the illustrated embodiments, but the present disclosure is not limited thereto, and the configuration of each portion can be replaced with an arbitrary configuration having the same function. Further, another arbitrary constituent element may be added to any of the embodiments of the present disclosure. Moreover, the embodiments may be combined as appropriate with each other.

What is claimed is:

1. A vibrator device comprising:
   a package including a base that is a semiconductor substrate and a lid that is a semiconductor substrate, the package having a housing section therein;
   a vibrator element and a passive element housed in the housing section and placed at the base;
   an oscillation circuit placed at the base and electrically coupled to the vibrator element; and
   a mounting terminal placed at the package and electrically coupled to the passive element,
   wherein at least one of the base and the lid is coupled to fixed potential, and
   the oscillation circuit is so placed as to face a surface of the base that is an opposite surface from the housing section.

2. The vibrator device according to claim 1, wherein the base and the lid are each coupled to the fixed potential.

3. The vibrator device according to claim 1, wherein the housing section includes a first housing section that houses the vibrator element and a second housing section that houses the passive element.

4. The vibrator device according to claim 1, wherein the package includes a spacer interposed between the base and the lid and integrated with the vibrator element.

5. The vibrator device according to claim 1, wherein the passive element is a thin-film-shaped element integrated with a surface of the base that is the surface facing the housing section.

6. A vibrator device comprising:
   a package including a base that is a semiconductor substrate and a lid that is a semiconductor substrate, the package having a housing section therein, the base facing the lid along a first direction;
   a vibrator element and a passive element housed in the housing section and placed at the base;
   an oscillation circuit placed at the base and electrically coupled to the vibrator element; and
   a mounting terminal placed at the package and electrically coupled to the passive element,
   wherein at least one of the base and the lid is coupled to fixed potential,
   the vibrator element is aligned with the oscillation circuit along the first direction, and
   the passive element is laterally shifted from both the vibrator element and the oscillation circuit along a second direction perpendicular to the first direction and is misaligned with both the vibrator element and the oscillation circuit along the first direction.

7. The vibrator device according to claim 6, wherein the base and the lid are each coupled to the fixed potential.

8. The vibrator device according to claim 6, wherein the housing section includes a first housing section that houses the vibrator element and a second housing section that houses the passive element.

9. The vibrator device according to claim 6, wherein the oscillation circuit is so placed as to face a surface of the base that is an opposite surface from the housing section.

10. The vibrator device according to claim 6, wherein the package includes a spacer interposed between the base and the lid and integrated with the vibrator element.

11. The vibrator device according to claim 6, wherein the passive element is a thin-film-shaped element integrated with a surface of the base that is the surface facing the housing section.

* * * * *